(12) United States Patent
Jarosz et al.

(10) Patent No.: US 8,677,307 B1
(45) Date of Patent: Mar. 18, 2014

(54) METHOD AND SYSTEM FOR IMPLEMENTING DIE SIZE ADJUSTMENT AND VISUALIZATION

(75) Inventors: Joseph P. Jarosz, Sunnyvale, CA (US); Thaddeus C. McCracken, Portland, OR (US)

(73) Assignee: Cadence Design Systems, Inc., San Jose, CA (US)

( * ) Notice: Subject to any disclaimer, the term of this patent is extended or adjusted under 35 U.S.C. 154(b) by 34 days.

(21) Appl. No.: 13/219,534

(22) Filed: Aug. 26, 2011

(51) Int. Cl.
*G06F 17/50* (2006.01)

(52) U.S. Cl.
USPC .......................................................... 716/139

(58) Field of Classification Search
USPC ................................................ 716/139, 118
See application file for complete search history.

(56) References Cited

U.S. PATENT DOCUMENTS

| | | | |
|---|---|---|---|
| 6,704,916 B1* | 3/2004 | Nishida et al. ................. | 716/108 |
| 2003/0179238 A1* | 9/2003 | Roh .............................. | 345/767 |
| 2006/0155732 A1* | 7/2006 | Momose et al. ............. | 707/101 |
| 2009/0049406 A1* | 2/2009 | Epstein ........................ | 715/810 |

OTHER PUBLICATIONS

Corel Digital Studio 2010—Reviewer's Guide, 2009.

* cited by examiner

*Primary Examiner* — Thuan Do
*Assistant Examiner* — Mohammed Alam
(74) *Attorney, Agent, or Firm* — Vista IP Law Group, LLP

(57) ABSTRACT

Disclosed are improved methods, systems, and computer program products for visualizing and estimating IC die arrangement for an electronic design, and for performing chip planning and estimation based upon the estimated and visualized IC die arrangements. According to some approaches, an interface is provided for visualizing different die arrangement options for an electronic design, in which a filmstrip view is provided to display smaller images of different die arrangement options, and a central viewing area is provided to view a larger image of a selected candidate die arrangement. The different images, whether smaller or larger images, are maintained with design object information and not just static images. This allows for selection and highlighting of individual objects within the die arrangement images, as well as corresponding highlighting of that same object in other images.

27 Claims, 8 Drawing Sheets

METHOD AND SYSTEM FOR IMPLEMENTING DIE SIZE ADJUSTMENT AND VISUALIZATION

BACKGROUND

The invention is directed to an improved approach for implementing and visualizing die designs.

A semiconductor integrated circuit (IC) has a large number of electronic components, such as transistors, logic gates, diodes, wires, etc., that are fabricated by forming layers of different materials and of different geometric shapes on various regions of a silicon wafer.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters.

The EDA tools may also be used to perform early stage analysis and examinations of an electronic design. For example, the process of performing chip planning can be greatly facilitated if the designer or chip planning tool can predict the expected die size and configuration for the IC product. However, the die size and configuration of the IC product is significantly affected by the configuration of the I/O ring and cores needed to support the IC product. The I/O ring is a top-level component within which all I/O related logic is instantiated, and is usually positioned around the periphery of the IC chip. Typical components on the I/O ring include, for example, I/O cells, power and ground cells, boundary scan registers (BSRs), pin structures, and/or other glue-logic structures. The IC core typically resides within the boundaries of the I/O ring, with the core typically including the internal blocks and connectivity of the IC chip.

For planning purposes, it is very desirable for engineers and architects to be able to obtain and visually review accurate estimates of the I/O ring and IC core configuration for the final IC product. One reason this functionality is useful is because this type of visualization and estimation allows the engineer or architect to know the required die size for the product. For example, consider that the I/O ring creates the peripheral boundary of the IC chip, which means that the amount of space available for the IC core is greatly affected by the size of the I/O ring. Therefore, the size and dimensions of the die are also greatly affected by the required dimensions of the I/O ring and the IC core structures. The size of the die for the IC product must be large enough to hold the required I/O ring structures as well as the core structures. Clearly, the most efficient die size is the situation when the dimensions of the minimum I/O ring periphery creates enough interior space to exactly match the required space of the core. If the total size of the periphery for the I/O ring is greater than what is needed to implement the core, the design is said to be "I/O limited". A design is "core limited" if the core requires more space than the minimum periphery required to implement the I/O ring.

For a given electronic design, there may be any number of possible configurations that may be implemented for the die arrangement. The problem is that the designer often is not able to effectively visualize those different die arrangements along with their dimensional specifications, and hence is often not able to identify the most optimal die arrangement from among the different die arrangement options.

SUMMARY

Embodiments of the present invention provide an improved method, system, and computer program product for visualizing and estimating IC die arrangement for an electronic design, and for performing chip planning and estimation based upon the estimated and visualized IC die arrangements. According to some embodiments, an interface is provided for visualizing different die arrangement options for an electronic design, in which a filmstrip view is provided to display smaller images of different die arrangement options, and a central viewing area is provided to view a larger image of a selected candidate die arrangement. The different images, whether smaller or larger images, are maintained with design object information and not just static images. This allows for selection and highlighting of individual objects within the die arrangement images, as well as corresponding highlighting of that same object in other images.

Other additional objects, features, and advantages of the invention are described in the detailed description, figures, and claims.

DETAILED DESCRIPTION

Embodiments of the present invention provide an improved method, system, and computer program product for visualizing and estimating IC die arrangement for an electronic design, and for performing chip planning and estimation based upon the estimated and visualized IC die arrangements. According to some embodiments, an interface is provided for visualizing different die arrangement options for an electronic design, in which a filmstrip view is provided to display smaller images of different die arrangement options, and a central viewing area is provided to view a larger image of a selected candidate die arrangement. The different images, whether smaller or larger images, are maintained with design object information and not just static images. This allows for selection and highlighting of individual objects within the die arrangement images, as well as corresponding highlighting of that same object in other images.

Figure 1:
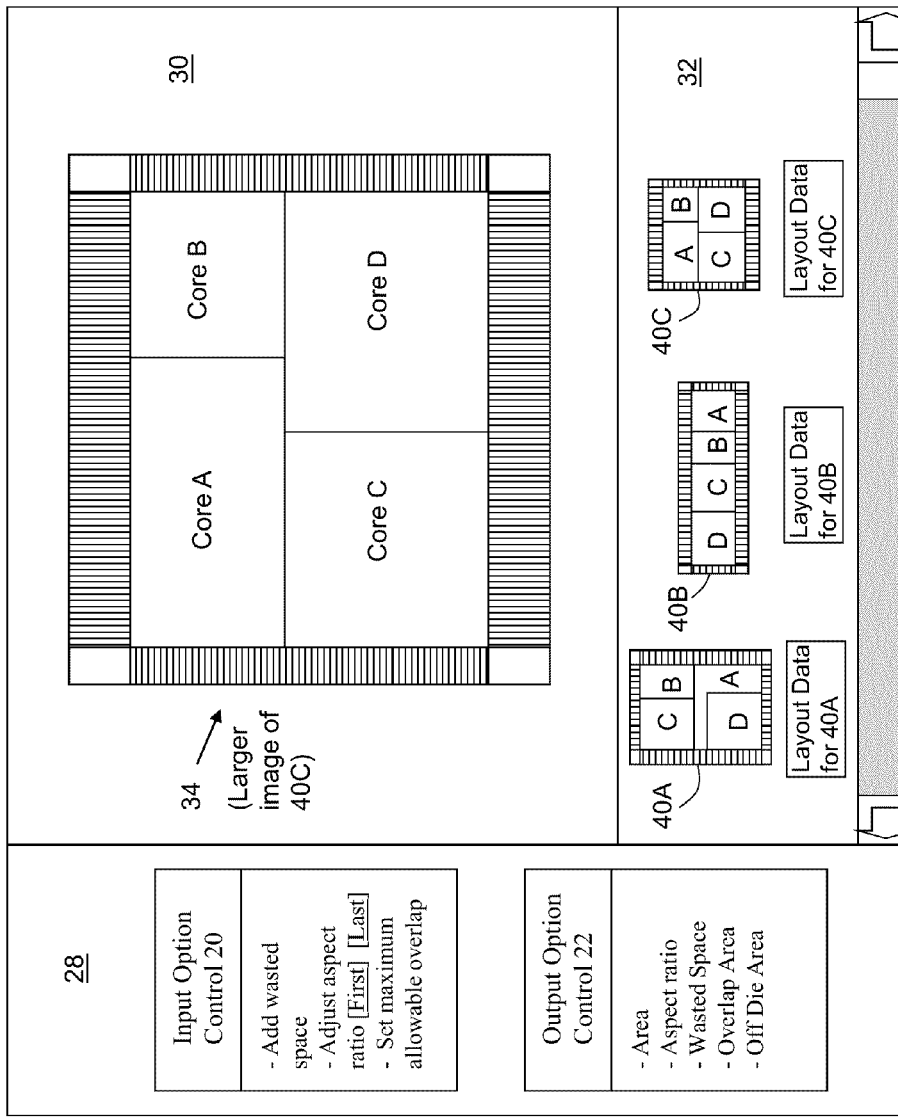
FIG. 1 depicts an interface for performing die visualization and design according to some embodiments of the invention.

FIG. 1 illustrates an example interface 10 for visualizing and controlling alternative die arrangements according to some embodiments of the invention. Interface 10 includes three different interface areas. A control area 28 is provided to allow for control over the die parameters and output display options. A main viewing area 30 is provided to allow for visualizing of a selected die arrangement. A filmstrip area 32 allows for smaller image views of the different alternative die arrangements to be displayed.

The general idea is that this type of interface 10 provides a mechanism for allowing a user to effectively visualize and explore different die arrangements options. Therefore, the control area 28 includes an input option control 20 to allow the user to specify different options for the die design. For example, the user can use the input option control 20 to specify a range of different aspect ratios that can be employed for the die arrangement. What this means is that candidate die arrangement are identified using this control parameters, where identification and generation of the candidate die arrangements must have sufficient perimeter dimensions to meet I/O ring requirements. The aspect ratios then can be used to generate different die arrangements that meet these I/O ring and core requirements. The chip planning tool will take the different options and generate different die arrangement candidates for display to the user.

The control area 28 also includes an output option control that can be used to specify the display options for the different candidate die arrangements to be presented to the user. For example, the output option control 22 can be used to specify the layout data for each candidate die arrangements, such as the area, aspect ratio, wasted space, overlap area, and off die area of the different options for the die arrangements.

The filmstrip area 32 displays the different die arrangement options that conform to the electronic design requirements and control parameters set by the user. The example of FIG. 1 shows three different die arrangement options 40A, 40B, and 40C. Each one of these die arrangement options is different from one another. For example they may differ based on different aspect ratios, area, wasted space, overlap area, and/or off die area. The different layout characteristics are listed in the layout data area of the filmstrip view.

A scrollbar element may be placed within the filmstrip view area 32. The scrollbar element 52 allows the user to scroll through the different die arrangement options, even if there are too many candidate die arrangements than can fit onto the thumbnail viewing area 32 at the same time.

Any of the candidate die arrangements can be selected to be displayed in greater size and detail in the main viewing area 30. This allows a selected die arrangement to be displayed to the user in higher resolution. In addition, this also permits the selected die arrangement to be viewed with different viewing modes, e.g., to zoom in on the image.

Figure 2:
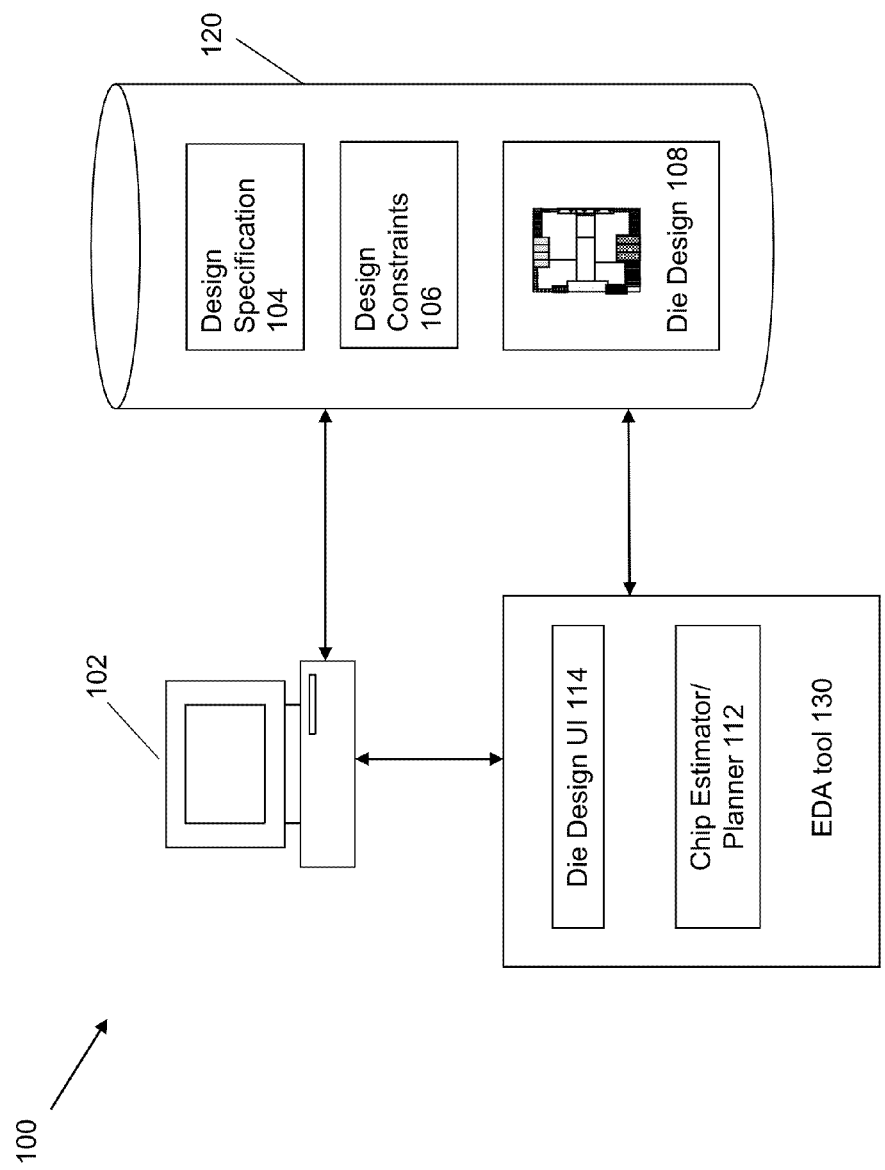
FIG. 2 illustrates an example system for performing die visualization and design according to some embodiments of the invention.

FIG. 2 shows an architecture of a system 100 for viewing and implementing different candidate die arrangements according to some embodiments of the invention. System 100 may include one or more users at one or more user stations 102 that operate the system 100 to design, edit, and/or plan die layouts for an electronic design. The users at user station 102 correspond to any individual, organization, or other entity that uses system 100 for planning or designing an electronic design. Such users include, for example, chip architects, product designers, design engineers, and/or verification engineers. User station 102 comprises any type of computing station that may be used to operate, interface with, or implement EDA tools, applications or devices 130. Examples of such user stations 102 include for example, workstations, personal computers, or remote computing terminals. User station 102 comprises a display device, such as a display monitor, for displaying electronic design layouts and processing results to users at the user station 102. User station 102 also comprises one or more input devices for the user to provide operational control over the activities of system 100, such as a mouse or keyboard to manipulate a pointing object in a graphical user interface.

The user station 102 may be associated with one or more computer readable mediums or storage devices 120 that hold data regarding the die design 108, design specifications 104 and/or constraints 106 relating to the proposed electronic design. Computer readable storage device 120 comprises any combination of hardware and software that allows for ready access to the data that is located at the computer readable storage device 120. For example, computer readable storage device 120 could be implemented as computer memory operatively managed by an operating system. The computer readable storage device 120 could also be implemented as an electronic database system having storage on persistent and/or non-persistent storage.

The one or more design specifications 104 comprise any set of information or parameters that the user has developed for information relating to the electronic design or die design 108. The specification 104 includes the list of components that should be included within the I/O ring, such as I/O cells, power and ground cells, boundary scan registers (BSRs), pin structures, and/or other glue-logic structures. The specification also includes information about the IC cores, such as soft IP, hard IP, and cells.

One or more design constraints 106 may also be stored in database 120. The design constraints comprise additional specifications for the I/O ring and/or IC core that control the allowable configurations for the die design 108. For example, these constraints 108 may be set by the user in control are 20 of interface 10 to include user specified aspect ratios and/or allowable overlaps. Therefore, the specification 104 and design constraints 106 may include some or all of the following items of information according to some embodiments of the invention:

Target Aspect Ratio: This information identifies the expected aspect ratio for the IC product. The aspect ratio is defined in some implementations as the Height divided by the Width of the IC product.

I/O Placement: This information identifies the expected placement locations for certain items within the I/O ring. The user or design may need to place certain I/O cells at particular locations within the I/O ring, e.g., to place certain memory-related I/O cells at the left side of the I/O ring.

I/O Proximity: This information identifies when certain I/O components must be placed near other I/O components. The reason for this constraint is to ensure that I/O cells having the same functionality are placed together in the I/O ring.

I/O Ordering: This information identifies the order in which I/O cells and/or components need to be placed within the I/O ring. One reasons for specifying an order for the I/O components is to control the proximity of certain sets or segments of I/O cells relative to other sets or segments of I/O cells.

Corner packing. This information identifies whether the I/O ring should include I/O cells in the corners. For a typical wirebond design, it is likely that I/O cells will not be placed into the corners of the I/O ring, since conventional technologies do not allow the corners to be bonded to the bond pads. Therefore, the wirebond design will typically turn off corner packing and include nonfunctional corner cells in the corners. However, the designer of a flip-chip implementation may choose to allow I/Ocells to be packed in the corners of the I/O ring, and therefore may chose to turn on corner packing for the I/O ring design to reduce the size of the die.

Stacking. This information identifies whether I/O cells can be stacked at the ring periphery. This is an option that can be taken to reduce die size, at the expense of possibly increasing package costs by requiring one or more additional re-distribution layers.

Rotation restrictions: This information identifies the limitations placed on certain I/O components when placed at certain locations or sides on the I/O ring, particularly with respect to whether a given I/O cell can be rotated.

Size of core: This information provides sufficient data to understand the space requirements for the core. The reason for this information is because the I/O ring must be sufficiently large to provide enough space for the core components.

In operation, the user at user station 102 provides a chip estimator/planner 112 of an EDA tool 130 with a specification 104. The user may also utilize a die design/visualization UI 114 to set constraints 106 for the die design 108. The chip estimator/planner 112 will use the specification 104 and design constraints 106 to generate a set of candidate die designs 108. The user can then visualize and perform analysis upon the different die designs 108. For example, for chip planning purposes, die size estimation can be performed once the die designs 108 have been generated. In addition to chip planning, the die designs 108 can be used for prototyping purposes. Moreover, the die designs 108 can be passed to downstream design tools to help construct the actual layout for the IC product. Analysis results may be stored in the compute readable storage medium 120 or displayed on a display device at user station 102.

Figure 3:
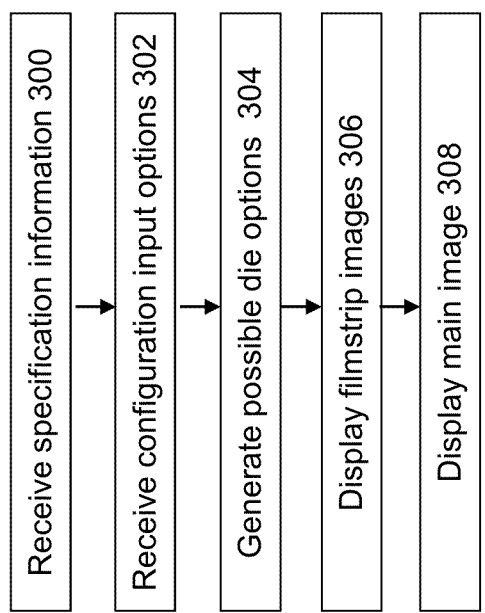
FIG. 3 illustrates a flow of an approach for performing die visualization and design according to some embodiments of the invention.

FIG. 3 shows a flowchart of an approach for implementing an interface for visualizing and controlling candidate die arrangements. At 300, specification/configuration information is received for the electronic design. The specification/configuration information includes any set of information or parameters that the user has developed for information relating to the electronic design or die design. The specification/configuration information includes the list of components that should be included within the I/O ring, such as I/O cells, power and ground cells, boundary scan registers (BSRs), pin structures, and/or other glue-logic structures. The specification also includes information about the IC cores, such as soft IP, hard IP, and cells.

At 302, input options are received. These input options comprise any set of constraints that the user may place upon the different candidate die arrangements. The input options therefore form additional specifications for the I/O ring and/or IC core that control the allowable configurations for the die designs. For example, these constraints may be set by the user in the control area of interface to include user specified aspect ratios and/or allowable overlaps.

At 304, the different candidate die arrangements are generated. The chip planning tool identifies the different die arrangements that meet the requirements of the specification and the constraints. This means that the candidate die arrangements must meet the design requirements and should include sufficient area and dimensional a requirements to fit the IC cores.

The filmstrip images are then displayed to the user at 306. In addition, at 308, the main viewing area is populated with the image for one of the candidate die arrangements. FIG. 1 shows an example of how these images may be displayed in an example interface.

Figure 4:
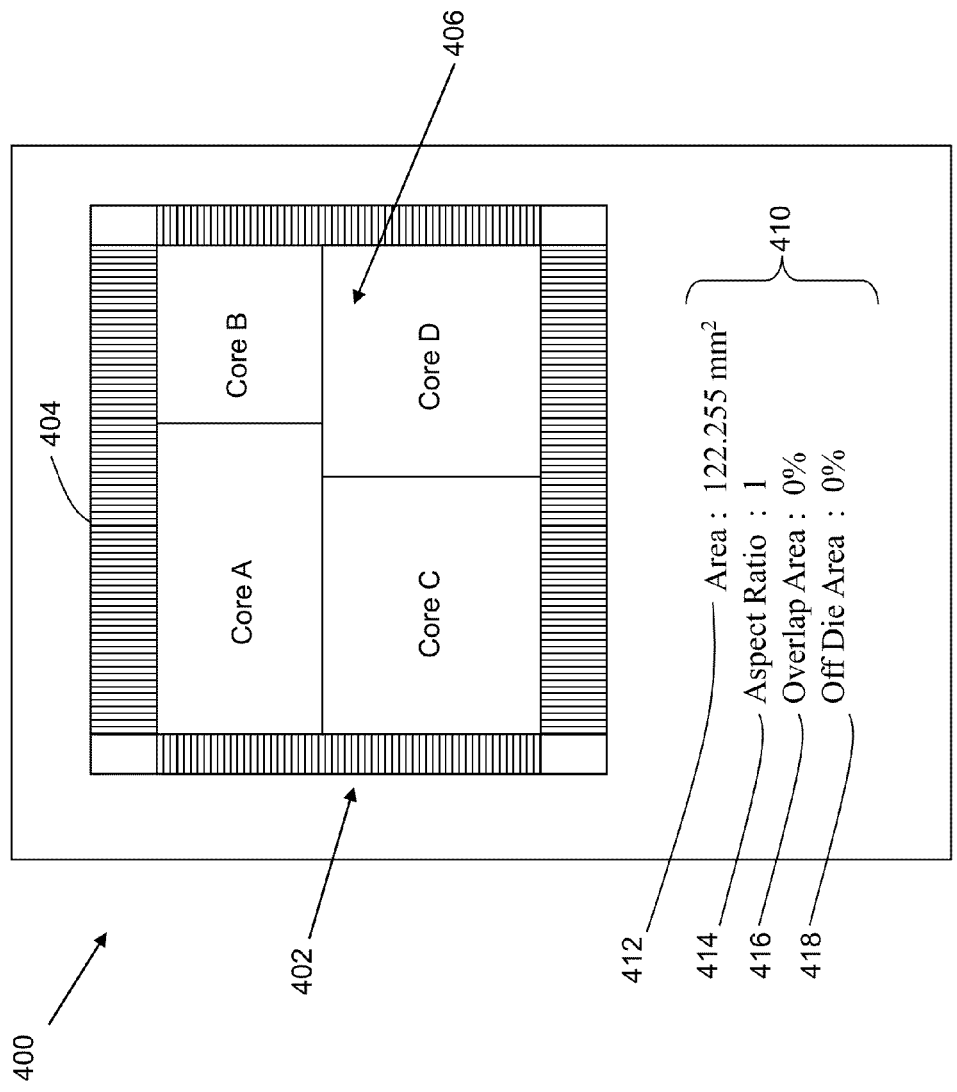
FIG. 4 illustrates an example interface for displaying an image and die layout information for a candidate die arrangement according to some embodiments of the invention.

FIG. 4 illustrates an example image from the filmstrip viewing area of the interface. In one embodiment, the images in the filmstrip viewing area are not static images. Instead, each image in the filmstrip viewing area corresponds to an image that includes the design intent and specific object data for that candidate die arrangement. In other words, the displayed images are based at least in part on live data for the displayed objects within the candidate die arrangement.

This means that the I/O ring objects 404 and core objects 406 shown in the die arrangement 402 are displayed based on actual design objects for the die arrangement 402. This is in contrast to alternative approaches that may merely create and maintain a static bitmap image for each of the filmstrip image views. This approach of using live design data is useful for many reasons. For example, as discussed in more detail, this approach allows the objects within the die arrangement 402 to be individually selected and highlighted, even across different candidate die arrangements.

The filmstrip viewing area also can be configured to display design information 410 about each of the candidate die arrangements. For example, the displayed design information 410 may include display information 412 for the area of the candidate die arrangement. In addition, display information 414 may be presented to identify the aspect ratio of the candidate die arrangement. Display information 416 may be used to display the overlap area of the candidate die arrangement and display area 418 may be used to show the off die area percentage for the candidate die arrangement.

As previously noted, some embodiments of the invention are implemented such that the images displayed in the filmstrip viewing area are not static images, but are instead based on actual design information for the candidate die arrangements.

Figure 5:
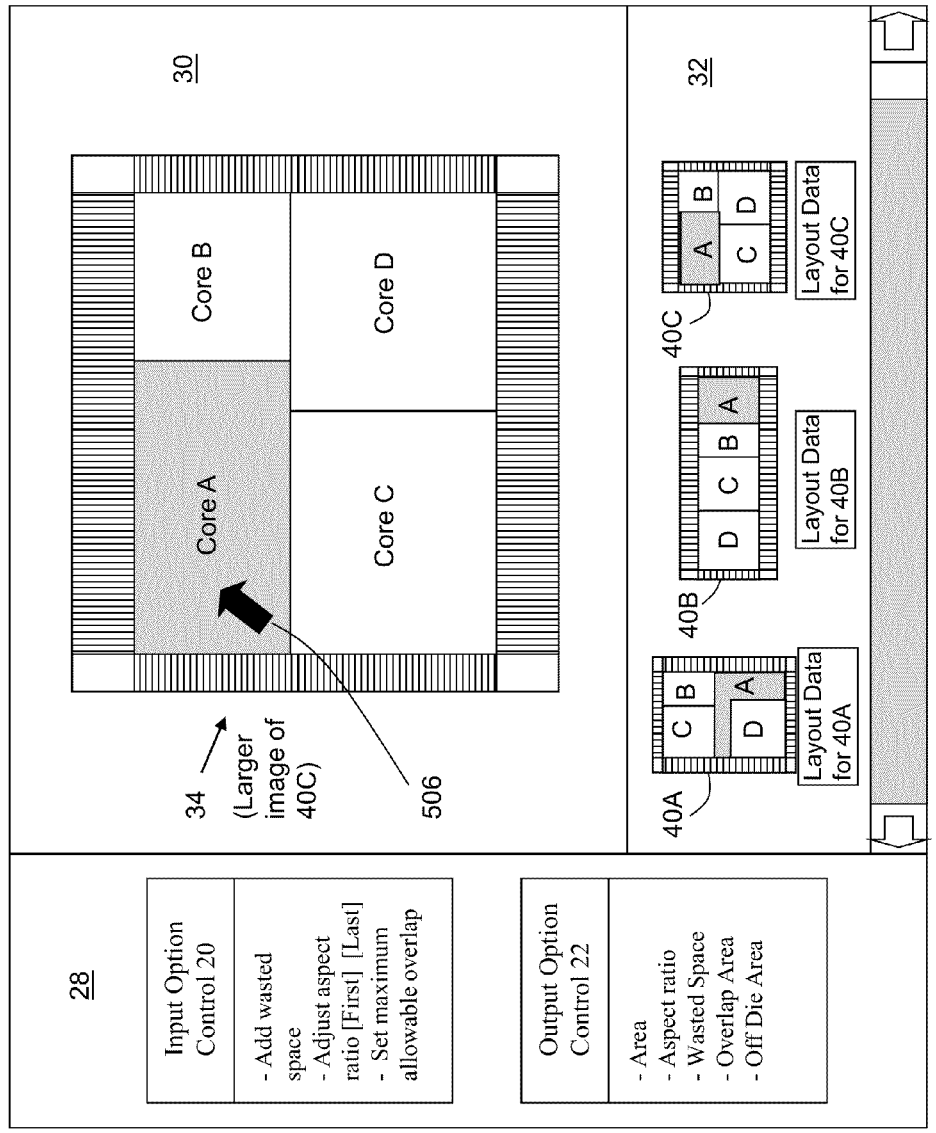
FIG. 5 illustrates selection of an object in a candidate die arrangement according to some embodiments of the invention.

To explain, consider the interface view shown in FIG. 5. This example interface shows three candidate die arrangements 40A, 40B, and 40C in the film strip viewing area 32. Each of these die arrangements are candidate die arrangements that meet the design specification requirements and the user selected input options.

The issue is that the user will want to be able to use the interface to efficiently view and understand the differences between the different candidate die arrangements. In particular, the user may want to understand how the core configurations differ between the different candidate die arrangements.

To this end, the user may wish to use a pointer device 506 (e.g., a mouse pointer) to select one or more cores for highlighting within a displayed die arrangement. For example the interface of FIG. 5 shows that the user has used the pointer 506 to select core A, such that core A is now highlighted in the main viewing area 30.

In some embodiments of the invention, the interface 30 will correspondingly highlight that same object (core A) in the smaller images in the filmstrip viewing area 32. Therefore, that same core A is highlighted in each of the smaller images for die arrangements 40A, 40B, and 40C.

This makes it very easy for a user to visually see and understand how that core A is implemented in each of the different candidate die arrangements. For example, in die arrangement 40A, the highlighting very easily allows a user to see that core A has been shaped into a non-rectangular shape that extends horizontally across the die and along the bottom right-hand side of the die. In the die arrangement 40B, the highlighting allows the user to quickly see that core A has been placed along the right-hand portion of the core area. In die arrangement 40C, the highlighting visually permits the user to see that core A has been placed on the top left portion of the core area.

While this example has been made very simplistic for purposes of illustration with only a small number of core objects, those of ordinary skill in the art would realize that a typical die design may include a very large number of core objects in the core area. In the more complicated scenario, this feature of being able to highlight an object in one image, and have that same object in other images be corresponding highlighted would provide a very distinct advantage in being able to visually understand the actual impact of the different die arrangements.

For example, if the user does not want the die design to make the core A into a non-rectangular shape, then the highlighting allows the user to very quickly identify this issue with die arrangement 40A, and to therefore easily reject this candidate arrangement. Similarly, if the user prefers the core A to be placed along a specific side of the I/O ring, then this approach allows the user to very quickly and visually identify which of the die arrangements would match the user preference, e.g., to identify die arrangement 40B if the user preference is to have core A along the right-hand side of the I/O ring and to identify die arrangement 40C if the preference is to have the core A along the upper side of the I/O ring.

This feature of being able to select an object is not restricted to selecting from just the main viewing area 30. Using some embodiments of the invention, objects can also be selected from the smaller images in the filmstrip viewing area 32, which corresponding highlights those same objects in both the main viewing area as well as the other images in the filmstrip viewing area 32. In addition this approach is not limited to selection of just the core object. Any object that is represented as object data in the images can be selected in a similar way, e.g., including both I/O ring objects and core objects.

Figure 6:
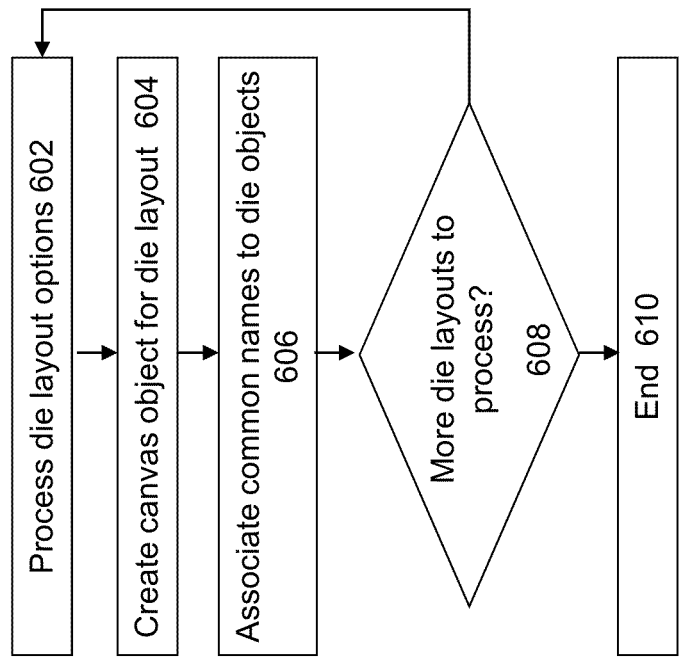
FIG. 6 illustrates a flow of an approach for generating candidate die arrangements according to some embodiments of the invention.

FIG. 6 shows a flowchart of an approach for generating the different die arrangements according to some embodiments of the invention to allow this type of object selection between images. In this approach, the images are not represented as strictly static bitmap images, but are instead built upon live image data (e.g., corresponding to the physical or mathematical related layout properties of the objects) that include data for objects within the die arrangement images. At 602, the different die layout options are received and are processed to identify the different candidate die arrangements.

At 604, a "canvas" object is created for a candidate die layout. The canvas object is a computing workspace that computes the dimensions of the die arrangement, and then inserts the die layout objects into the canvas object to form the die arrangement. Therefore, the canvas object will include the I/O ring configuration having the I/O ring objects, and will also include core objects inserted into the core area. The canvas object will therefore retain the design intelligence behind the constitute objects that make up the die arrangement.

At 606, common names are associated with the objects in the die arrangement. When each different canvas object is created for each different die arrangement, the objects themselves in each canvas object will differ from one another, e.g., will be associated with different object IDs. However, there will be objects within each canvas object that as an entity correspond to each other across the different canvas objects. For example, a given core object may need to be placed into the core area in each canvas object/candidate die arrangement. However, that core object may very well differ between the different canvas objects, e.g., by having different object identifiers, sizes, shapes, and locations. To retain the correspondence between those objects, those objects will, at 606, be associated with a common name that is shared across all of the canvas objects.

At 608, a check is made to determine whether there are more die arrangements to process in this way, where the flow loops back to 602 to continue processing of each candidate die arrangements until there are no further candidate arrangements to process.

Figure 7:
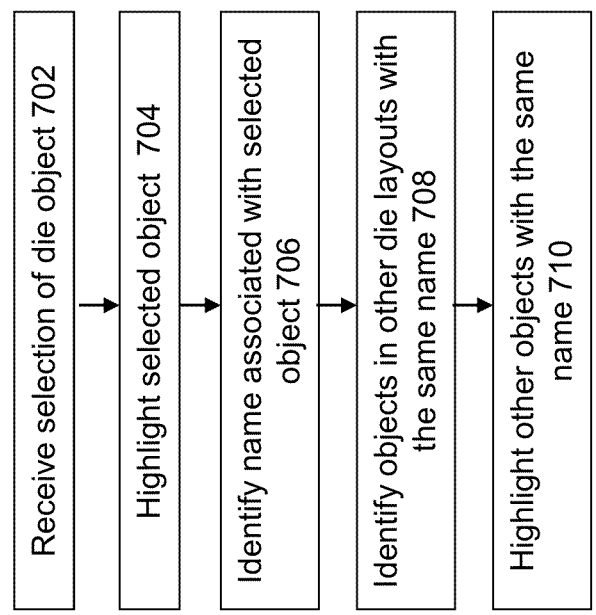
FIG. 7 illustrates a flow of an approach for performing selection of an object in a candidate die arrangement according to some embodiments of the invention.

FIG. 7 shows a flowchart of an approach to enable highlighting of common objects between the different images. At 702, receipt is made of a selection of an object in one of the displayed images. For example, the interface may allow the user to use a pointer to select an object in either the filmstrip view area or the image in the main viewing area.

At 704, the selected object is highlighted. Any visually distinguishing approach can be taken to highlight the selected object. For example, different levels of shading, coloring, and/or patterning may be employed to highlight a selected object.

At 706, identification is made of the name that is associated with the selected object. Recall that each object is associated with a name that transcends that individual die arrangement, but is instead associated and shared with all like objects in the different die arrangements. Therefore, at 708, objects in the other die arrangement having the same name are identified. Thereafter, at 710, those objects having the same name in the other die arrangements are also highlighted.

One potential issue when working with live images in this manner is that there may be certain performance drawbacks when operating with the filmstrip images. For example, consider the process of scrolling through the filmstrip area to view the different candidate die arrangements. With live image data, the scrolling of the images may cause viewing delays due to the need to constantly re-draw the images as the scrolling occurs.

To address this issue, some embodiments implements "double buffering" to generate image data for the die arrangements in an off-screen buffer. When some movement or other manipulation of the image is required, then the data in the off-screen buffer may be used to generate a display image rather than requiring an in-promptu re-drawing of that image data.

Therefore, what has been described is an improved approach for implementing and viewing die arrangements for an electronic design. An interface is provided that allows efficient and effective visualization of the different candidate die arrangement options for an electronic design, in which a filmstrip view is provided to display smaller images of different die arrangement options, and a central viewing area is provided to view a larger image of a selected candidate die arrangement. The different images, whether smaller or larger images, are maintained with design object information and not just static images. This allows for selection and highlighting of individual objects within the die arrangement images, as well as corresponding highlighting of that same object in other images.

System Architecture Overview

Figure 8:
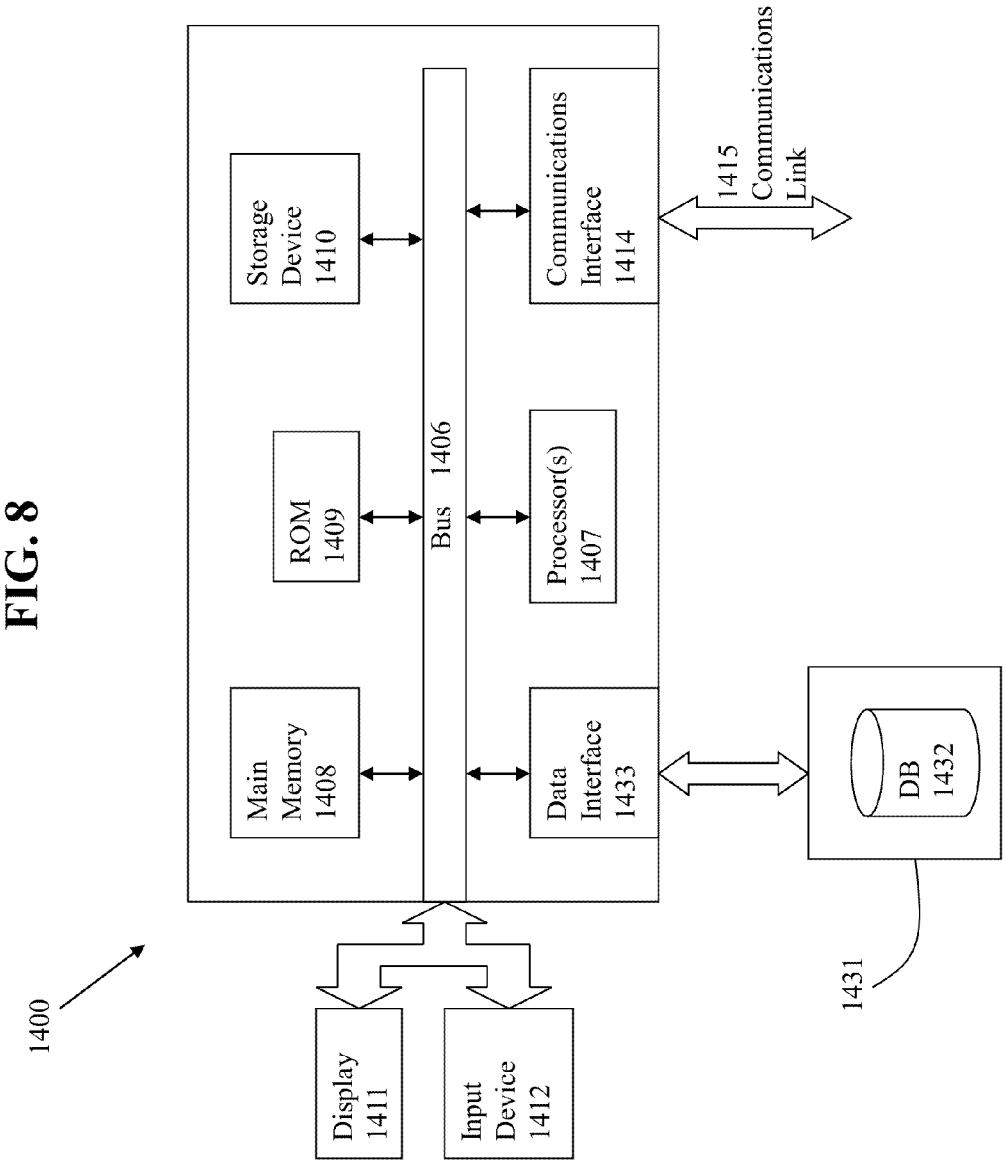
FIG. 8 shows an architecture of an example computing system with which the invention may be implemented.

FIG. 8 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer-implemented method implemented with a processor for implementing a die design for an electronic circuit, comprising:

using at least the processor to perform a process, the process comprising:

receiving specification information and configuration options for the die design of the electronic circuit;

determining die layout options, each of which includes a different arrangement for an entire layout of the die design of the electronic circuit, based at least in part upon the specification information or the configuration options for the die design of the electronic circuit;

generating a main display for a selected one of the die layout options; and generating smaller displays for others of the die layout options, wherein a smaller display presents the entire layout according to at least one die layout option of the others of the die layout options.

2. The method of claim 1 in which the smaller displays are organized as a filmstrip display.

3. The method of claim 1 in which the smaller displays correspond to object data for the die layout options instead of static images.

4. The method of claim 1 in which the configuration options controls allowable configurations for the die layout options.

5. The method of claim 4 in which the configuration options includes at least one of a target aspect ratio, I/O placement option, I/O proximity option, I/O ordering option, corner packing, stacking, rotation restriction, and core size.

6. The method of claim 1 in which selection or highlighting of an object in one of the die layout options results in corresponding selection or highlighting of the same object in others of the die layout options.

7. The method of claim 6 in which the object is selected or highlighted in either the main display or the smaller displays.

8. The method of claim 1 in which common objects are associated with a common name in the die layout options.

9. The method of claim 1 in which double buffering is employed to generate the smaller displays.

10. A computer program product embodied on a non-transitory computer usable medium, the non-transitory computer readable medium having stored thereon a sequence of instructions which, when executed by a processor causes the processor to execute a method for implementing a die design for an electronic circuit, the method comprising:

receiving specification information and configuration options for the die design of the electronic circuit;

determining die layout options, each of which includes a different arrangement for an entire layout of the die design of for the electronic circuit, based at least in part upon the specification information or the configuration options for the die design of the electronic circuit;

generating a main display for a selected one of the die layout options; and generating smaller displays for others of the die layout options, wherein a smaller display presents the entire layout according to at least one die layout option of the others of the die layout options.

11. The computer program product of claim 10 in which the smaller displays are organized as a filmstrip display.

12. The computer program product of claim 10 in which the smaller displays correspond to object data for the die layout options instead of static images.

13. The computer program product of claim 10 in which the configuration options controls allowable configurations for the die layout options.

14. The computer program product of claim 13 in which the configuration options includes at least one of a target aspect ratio, I/O placement option, I/O proximity option, I/O ordering option, corner packing, stacking, rotation restriction, and core size.

15. The computer program product of claim 10 in which selection or highlighting of an object in one of the die layout options results in corresponding selection or highlighting of the same object in others of the die layout options.

16. The computer program product of claim 15 in which the object is selected or highlighted in either the main display or the smaller displays.

17. The computer program product of claim 10 in which common objects are associated with a common name in the die layout options.

18. The computer program product of claim 10 in which double buffering is employed to generate the smaller displays.

19. A system for implementing a die design for an electronic circuit, comprising:
   a processor;
   a memory for holding programmable code, wherein the programmable code includes instructions which, when executed by the processor, causes the processor to:
      receive specification information and configuration options for an electronic circuit;
      determine die layout options, each of which includes a different arrangement for an entire layout of the die design of for the die design of the electronic circuit based at least in part upon the specification information or the configuration options for the die design of the electronic circuit;
      generate a main display for a selected one of the die layout options; and
      generate smaller displays for others of the die layout options, wherein a smaller display presents the entire layout according to at least one die layout option of the others of the die layout options.

20. The system of claim 19 in which the smaller displays are organized as a filmstrip display.

21. The system of claim 19 in which the smaller displays correspond to object data for the die layout options instead of static images.

22. The system of claim 19 in which the configuration options controls allowable configurations for the die layout options.

23. The system of claim 22 in which the configuration options includes at least one of a target aspect ratio, I/O placement option, I/O proximity option, I/O ordering option, corner packing, stacking, rotation restriction, and core size.

24. The system of claim 19 in which selection or highlighting of an object in one of the die layout options results in corresponding selection or highlighting of the same object in others of the die layout options.

25. The system of claim 24 in which the object is selected or highlighted in either the main display or the smaller displays.

26. The system of claim 19 in which common objects are associated with a common name in the die layout options.

27. The system of claim 19 in which double buffering is employed to generate the smaller displays.

* * * * *